US009146290B2

(12) United States Patent
Ylihautala et al.

(10) Patent No.: US 9,146,290 B2
(45) Date of Patent: Sep. 29, 2015

(54) RF TRANSMIT AND/OR RECEIVE ANTENNA FOR A HYBRID MRI/HIFU SYSTEM

(75) Inventors: Mika Petri Ylihautala, Vantaa (FI); Max Oskar Kohler, Espoo (FI); Annemaria Johanna Halkola, Helsinki (FI); Matti Olavi Lindstrom, Espoo (FI); Ilpo Asko Julius Koskela, Helsinki (FI); Jere Matti Nousiainen, Helsinki (FI)

(73) Assignee: Koninklijke Philips N.V., Eindhoven (NL)

( * ) Notice: Subject to any disclaimer, the term of this patent is extended or adjusted under 35 U.S.C. 154(b) by 555 days.

(21) Appl. No.: 13/519,186

(22) PCT Filed: Jan. 5, 2011

(86) PCT No.: PCT/IB2011/050039
§ 371 (c)(1),
(2), (4) Date: Jun. 26, 2012

(87) PCT Pub. No.: WO2011/083426
PCT Pub. Date: Jul. 14, 2011

(65) Prior Publication Data
US 2012/0286788 A1    Nov. 15, 2012

(30) Foreign Application Priority Data
Jan. 7, 2010   (EP) .................................. 10150236

(51) Int. Cl.
*G01V 3/00*   (2006.01)
*G01R 33/48*   (2006.01)
*G01R 33/28*   (2006.01)
*G01R 33/34*   (2006.01)
*G01R 33/341*   (2006.01)

(52) U.S. Cl.
CPC .......... *G01R 33/4814* (2013.01); *G01R 33/288* (2013.01); *G01R 33/34007* (2013.01); *G01R 33/481* (2013.01); *G01R 33/341* (2013.01)

(58) Field of Classification Search
CPC .................................................... G01R 33/4808
USPC ........... 600/411, 421, 427; 324/315, 318, 322
See application file for complete search history.

(56) References Cited

U.S. PATENT DOCUMENTS

| 4,556,070 A | 12/1985 | Vaguine et al. | |
|---|---|---|---|
| 7,463,030 B2 * | 12/2008 | He et al. | 324/318 |
| 7,771,418 B2 * | 8/2010 | Chopra et al. | 606/28 |

(Continued)

FOREIGN PATENT DOCUMENTS

EP      1286172      2/2003

OTHER PUBLICATIONS

Wharton, et al., Proce. Intl. Soc. Mag. Reson. Med. 14 (2006), p. 1413.

*Primary Examiner* — Louis Arana

(57) ABSTRACT

An RF/MR transmit and/or receive antenna is disclosed for use in a hybrid magnetic resonance imaging (MRI) system (or MR scanner), which comprises an MRI system and another imaging system for example in the form of a high intensity focused ultrasound (HIFU) system. The RF transmit and/or receive antenna (40, 50) is provided with respect to its conductor structure such that it does not disturb or in any other way detrimentally influence the related other (i.e. HIFU) of the two systems, especially if both systems are operated simultaneously and if the RF antenna is positioned in close proximity to an object to be imaged.

11 Claims, 4 Drawing Sheets

(56) References Cited

U.S. PATENT DOCUMENTS

| | | |
|---|---|---|
| 8,740,801 B2 * | 6/2014 | Salomir et al. ............... 600/459 |
| 2008/0021305 A1 | 1/2008 | He et al. |
| 2008/0143333 A1 | 6/2008 | Greim et al. |
| 2008/0238426 A1 | 10/2008 | He et al. |
| 2011/0043207 A1 | 2/2011 | Gross et al. |

* cited by examiner

RF TRANSMIT AND/OR RECEIVE ANTENNA FOR A HYBRID MRI/HIFU SYSTEM

FIELD OF THE INVENTION

The invention relates to an RF transmit and/or receive antenna for use in a hybrid magnetic resonance imaging (MRI) system (or MR scanner), which comprises an MRI system a high intensity focused ultrasound (HIFU) system, wherein the RF transmit and/or receive antenna is provided for transmitting RF excitation signals ($B_1$ field) for exciting nuclear magnetic resonances (NMR), and/or for receiving NMR relaxation signals. Further, the invention relates to a hybrid MRI system or MR scanner comprising such an RF transmit and/or receive antenna.

BACKGROUND OF THE INVENTION

In an MRI system or MR scanner, an examination object, usually a patient, is exposed to a uniform main magnetic field ($B_0$ field) so that the magnetic moments of the nuclei within the examination object tend to rotate around the axis of the applied $B_0$ field (Larmor precession) with a certain net magnetization of all nuclei parallel to the $B_0$ field. The rate of precession is called Larmor frequency which is dependent on the specific physical characteristics of the involved nuclei, namely their gyromagnetic ratio, and the strength of the applied $B_0$ field. The gyromagnetic ratio is the ratio between the magnetic moment and the spin of a nucleus.

By transmitting an RF excitation pulse ($B_1$ field) which is orthogonal to the $B_0$ field, generated by means of an RF transmit antenna, and matching the Larmor frequency of the nuclei of interest, the spins of the nuclei are excited and brought into phase, and a deflection of their net magnetization from the direction of the $B_0$ field is obtained, so that a transversal component in relation to the longitudinal component of the net magnetization is generated.

After termination of the RF excitation pulse, the relaxation processes of the longitudinal and transversal components of the net magnetization begin, until the net magnetization has returned to its equilibrium state. NMR relaxation signals which are emitted by the transversal relaxation process, are detected by means of an MR/RF receive antenna.

The received NMR signals which are time-based amplitude signals, are Fourier transformed to frequency-based NMR spectrum signals and processed for generating an MR image of the examination object. In order to obtain a spatial selection of a slice or volume within the examination object and a spatial encoding of the received NMR signals emanating from the slice or volume of interest, gradient magnetic fields are superimposed on the $B_0$ field, having the same direction as this $B_0$ field, but having gradients in the orthogonal x-, y- and z-directions. Due to the fact that the Larmor frequency is dependent on the strength of the magnetic field which is imposed on the nuclei, the Larmor frequency of the nuclei accordingly decreases along and with the decreasing gradient (and vice versa) of the total, superimposed $B_0$ field, so that by appropriately tuning the frequency of the transmitted RF excitation pulse (and by accordingly tuning the resonance frequency of the MR/RF receive antenna), and by accordingly controlling the gradient fields, a selection of nuclei within a slice at a certain location along each gradient in the x-, y- and z-direction, and by this, in total, within a certain voxel of the object can be obtained.

The above RF transmit and/or receive antennas are known both in the form of so-called MR body coils (also called whole body coils) which are fixedly mounted within an examination space of an MRI system for imaging a whole examination object, and as so-called MR surface coils which are directly arranged on a local zone or area to be examined and which are constructed e.g. in the form of flexible pads or sleeves or cages (head coil or birdcage coil).

As to the shape of the examination space, two types of MRI systems or MR scanners can be distinguished. The first one is the so-called open MRI system (vertical system) which comprises an examination zone, which is located between the ends of a vertical C-arm arrangement. The second one is an MRI system, also called axial MRI system, which comprises a horizontally extending tubular or cylindrical examination space.

In a high intensity focused ultrasound (HIFU) system focused ultrasound beams are used especially to destroy (pathogenic) target tissue by heating, wherein preferably an MRI system is used for controlling and monitoring the heating process by MRI thermometry. Such a hybrid MRI/HIFU system is also called MR guided focused ultrasound system (MRgFUS). U.S. Pat. No. 7,463,030 discloses a HIFU compatible MR receive coil for use in such a hybrid MRI/HIFU system.

SUMMARY OF THE INVENTION

It has revealed, that a common problem especially of the above mentioned hybrid MRI/HIFU systems is that the RF transmit and/or receive antenna of the MRI system disturbs or in any other way detrimentally influences the related other HIFU of the two systems, especially if both systems are operated simultaneously.

In a hybrid MRI/HIFU system of the invention it is achieved to keep the path of the ultrasound beams in the tissue as short as possible in order to avoid unwanted heating of tissue which surrounds the target tissue, as well as to avoid ultrasound attenuation and disturbances along the path of the ultrasound beams. In order to monitor the heating of the target tissue and of the tissue along the path of the ultrasound beams, specifically in the near field of the ultrasound transducer, a high quality of MRI thermometry is desired. This quality depends on the signal to noise ratio (SNR) of the MR images because the higher the SNR the better the spatial and temporal resolution can be used in the MRI thermometry resulting in more accurate estimate of the thermal dose. The SNR depends on the MR receive antenna used to detect the NMR relaxation signals. The SNR can be optimized when the MR receive antenna is located as close as possible to the imaged tissue. As a consequence the optimal location of the MR receive antenna is within the path of the ultrasound beams by which, however, the ultrasound is disturbed or attenuated or reflected or in another way detrimentally influenced.

A general object underlying the invention is to find a solution for these problems.

Especially, an object underlying the invention is to provide an RF transmit and/or receive antenna for use in a hybrid MRI/HIFU system, which does not or only to a minimum influence the related other of the two systems.

A further object underlying the invention is to provide an RF transmit and/or receive antenna for use in a hybrid MRI/HIFU system which allows generating MR images with a high signal to noise ratio without detrimentally disturbing the ultrasound field or beams.

These objects are solved by an RF transmit and/or receive antenna according to the invention.

The dependent claims disclose advantageous embodiments of the invention.

It will be appreciated that features of the invention are susceptible to being combined in any combination without departing from the scope of the invention as defined by the accompanying claims.

It is to be noted that the RF transmit and/or receive antenna of the invention can be employed in a conventional magnetic resonance examination system. This renders the magnetic resonance examination system ready to be upgraded into a hybrid MRI system without the need to replace the RF transmit and/or receive antennae.

Further details, features and advantages of the invention will become apparent from the following description of preferred and exemplary embodiments of the invention which are given with reference to the drawings.

DETAILED DESCRIPTION OF EMBODIMENTS

Figure 1:
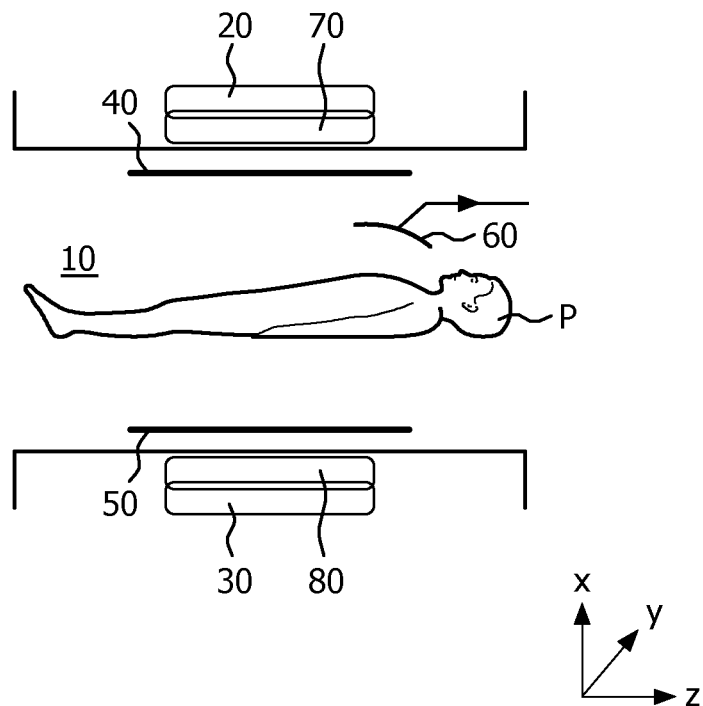
FIG. 1 shows a diagrammatic side view of a hybrid MRI system.

FIG. 1 shows substantial components of a magnetic resonance imaging (MRI) system or a magnetic resonance (MR) scanner comprising an RF transmit and/or receive antenna according to the invention. The HIFU components of such a hybrid system are not indicated in FIG. 1 but explained below with respect to the example of the RF transmit and/or receive antenna for the related hybrid MRI/HIFU system. In FIG. 1, a vertical (open) system is shown having an examination zone 10 between the upper and the lower end of a C-arm structure.

Above and underneath the examination zone 10 there are provided respective main magnet systems 20, 30 for generating an essentially uniform main magnetic field ($B_0$ field) for aligning the nuclear spins in the object to be examined. The main magnetic field essentially extends through a patient P in a direction perpendicular to the longitudinal axis of the patient P (that is, in the x direction).

Generally, a planar or at least approximately planar RF transmit antenna arrangement 40 (especially in the form of RF surface resonators) serves to generate the RF transmit excitation pulses ($B_1$ field) at the MR frequencies, said RF transmit antenna arrangement 40 being located in front of at least one of the magnet systems 20, 30. A planar or at least approximately planar RF receive antenna arrangement 50 serves to receive subsequent NMR relaxation signals from the related nuclei. This RF antenna arrangement may also be formed by RF surface resonators arranged in front of at least one of the magnet systems 20, 30. At least one common RF/MR antenna arrangement, especially an RF surface resonator, can also be used both for the RF pulse transmission and the reception of MR signals if it is suitably switched over between transmitting and receiving, or the two RF antenna arrangements 40, 50 can both serve for the alternating transmission of RF pulses and the reception of MR signals in common.

These RF transmit and/or receive antenna arrangements 40, 50 can be provided in the form of an RF transmit and/or receive antenna according to the invention as explained below.

Furthermore, for the spatial selection and spatial encoding of the received MR relaxation signals emanating from the nuclei, there is also provided a plurality of gradient magnetic field coils 70, 80 by which three gradient magnetic fields in the orthogonal x-, y- and z-directions are generated as explained above.

Finally, electrical accessory devices or auxiliary equipments are provided for given examinations. Such a device is, for example, an RF receive antenna in the form of an MR surface coil 60 which is used in addition or as an alternative to the permanently build-in planar RF receive antenna 50 (i.e. body coil) and which is arranged directly on the patient P or the zone to be examined. Such an RF/MR surface coil 60 is preferably constructed as a flexible pad or a sleeve or a cage and can comprise or be provided in the form of an RF transmit and/or receive antenna for transmitting an RF excitation pulse and/or for receiving NMR relaxation signals according to the invention.

The above and the following principles and considerations are also applicable in case of an axial or horizontal MRI system in which a patient or another examination object is guided in an axial direction through the cylindrical or tubular examination space 10. The shapes and dimensions of the magnets and RF transmit and/or receive antenna arrangements are adapted to the shape of the cylindrical or tubular examination space in a known manner.

Figure 2:
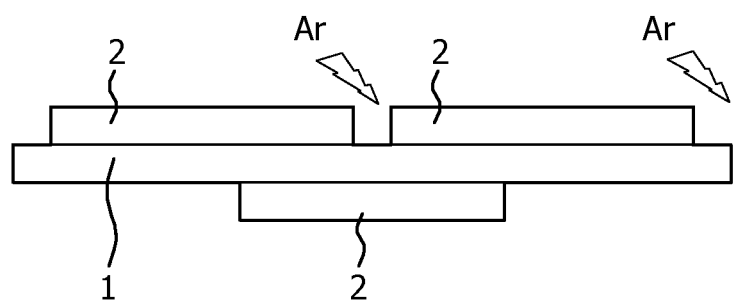
FIG. 2 shows a side sectional view of a part of a known RF transmit and/or receiver antenna.

The RF antenna can be provided in the form of or comprising a one- or multi-layer laminate or PCB (printed circuit board) conductor structure which comprises at least one electrically isolating carrier or substrate, which is provided with electrically conducting elements in the form of thin copper strips or copper structures on one or both sides of the at least one substrate. Capacitors can be realized by copper strips on both sides of the substrate which are overlapping each other and are separated by the substrate. Such a dual layer PCB structure is schematically shown in a side view in FIG. 2. It comprises the substrate 1 and the copper strips or structures 2 on both sides of the substrate 1. By the overlapping arrangement according to FIG. 2, a capacitor is realized.

In the following, the invention shall be explained in further detail with reference to a second embodiment of an RF transmit and/or receive antenna for a hybrid MR/HIFU system with reference to FIGS. 3 to 8.

As explained above, the optimal location for the RF transmit and/or receive antenna or at least a part of it is within the path of the ultrasound field or beams. However, such a positioning leads to a disturbance and attenuation of the ultrasound field or beams.

Usually, such RF transmit and/or receive antennas are provided in the form of coils or coil structures having conductors which are typically made of copper which is enclosed inside for example a plastic enclosure. When such a coil structure is located along the ultrasound path, it blocks the significant part of the ultrasound, thus affecting to the ultrasound focus quality and heating of the target tissue. Furthermore, the ultrasound power which is absorbed by the coil structure may damage the coil. These problems are currently solved by locating the antenna outside the ultrasound path and accepting the resulting disadvantages.

Figure 3:
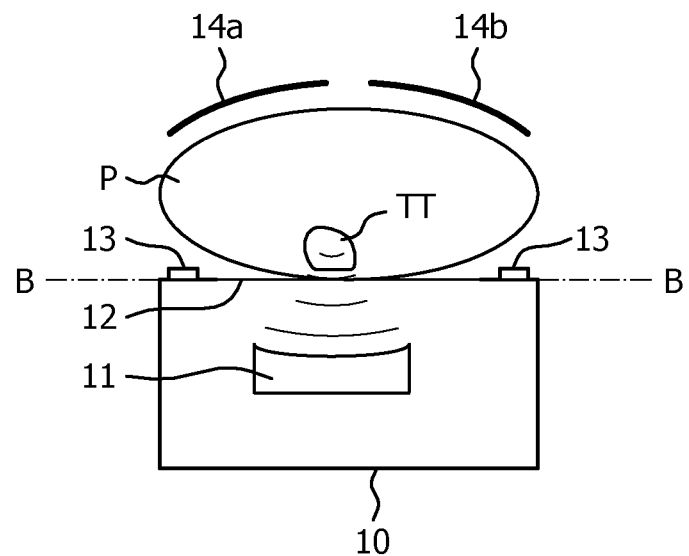
FIG. 3 shows a cross-sectional view of substantial components of a known hybrid MR/HIFU system.
Figure 4:
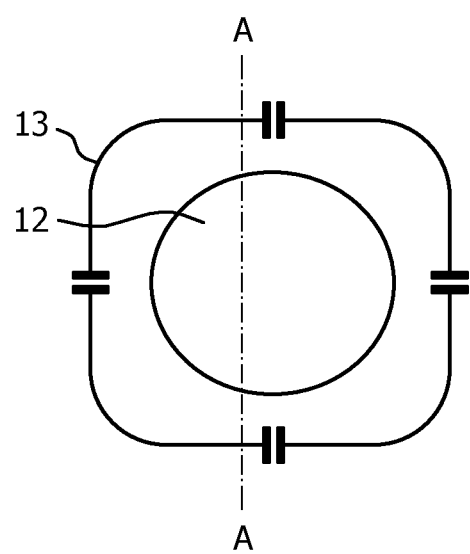
FIG. 4 shows a top view onto the components of the hybrid MR/HIFU system according to FIG. 3.

FIG. 3 shows a cross-sectional view along the line A-A in FIG. 4 of substantial components of such a known hybrid MR/HIFU system for uterine fibroid therapy. FIG. 4 shows a top view onto the system according to FIG. 3 along the line B-B in FIG. 3.

The hybrid MR/HIFU system comprises a tank 10 in which an ultrasound transducer 11 is arranged and which is filled with a coupling medium which is usually water or oil with suitable acoustic properties. The tank 10 comprises a window 12 which is transparent for the ultrasound field or beams emitted by the ultrasound transducer 11, and on which window 12 an examination object, usually a patient P is positioned. A first coil structure in the form of one first coil element 13 of the RF antenna is positioned surrounding the ultrasound window 12, and a second coil structure in the form of at least two coil elements 14a, 14b of the RF antenna is positioned beyond the patient P, e.g. in the form of pelvic coil elements. Further, FIG. 3 schematically indicates a target tissue TT within the patient P which is for example an uterine fibroid. In the top view of FIG. 4, the ultrasound window 12 of the tank 10 and the first coil element 13 of the RF antenna are shown.

In such a hybrid MR/HIFU system, the focused ultrasound beams are transmitted from the ultrasound transducer 11 through the coupling medium within the tank 10, through the ultrasound window 12 to the target tissue TT. The ultrasound beam is not disturbed by the first coil element 13 because it surrounds the ultrasound window 12 and has a diameter which is greater than the diameter of the ultrasound window 12. However, due to its large diameter, especially in relation to the small distance to the target tissue TT, the quality of the MR image of the target tissue TT which is generated by means of the first coil element 13 is comparatively bad. Although the second coil structure 14a, 14b of the RF antenna is further away from the target tissue TT and especially from the near field of the ultrasound transducer 11, it cannot compensate the decreased performance of the first coil element 13.

In order to solve this problem, an RF transmit and/or receive antenna according to the invention is provided which can be effectively positioned in close proximity to the target tissue TT without or only to a minimum disturbing the beams of the ultrasound, so that the MR image and the quality of the MRI thermometry can be optimized for the therapy.

The RF transmit and/or receive antenna according to the invention generally comprises a number of coils or coil elements or coil structures or parts thereof which are made such that they only minimally disturb the ultrasound field or beams. Such a minimal disturbance means that the RF transmit and/or receive antenna is not significantly changing the ultrasound focus properties, or does not create new significant ultrasound focuses (like side focuses) in unwanted locations, or does not reflect a significant part of the ultrasound energy back for example to the ultrasound transducer 11, or does not absorb a significant part of the ultrasound energy which could create a local hot-spot at or in the neighborhood of the RF transmit and/or receive antenna.

In order to obtain such a desired minimal disturbance, the RF transmit and/or receive antenna according to the invention is created as follows:

1.) The RF transmit and/or receive antenna comprises or is made of a conductor structure especially in the form of the above mentioned coils or coil elements or coil structures which is/are transparent to the ultrasound field or beams, wherein transparent means that the major part of the ultrasound energy is transmitted through the conductor structure. Such a transparency is achieved to a desired extent by one or a combination of the following features:
   a.) the materials of the conductor structures which are selected to have an acoustic impedance which is very different from the acoustic impedance of the ultrasound coupling medium within the tank 10, typically water or oil, are made thin. This means that the effective acoustic thickness of the structure is less than about $\lambda/10$ ($\lambda$ being the acoustic wavelength of the material);
   b.) the thicknesses of the conductor structures which are selected to have an acoustic impedance which is very different from the acoustic impedance of the ultrasound coupling medium within the tank 10, typically water or oil, are chosen to minimize the reflections at the medium boundaries. This is also known as "acoustic matching";
   c.) the materials of the conductor structures are chosen to have sufficiently low acoustic losses in order to avoid significant absorption of the ultrasound energy.

2.) The RF transmit and/or receive antenna comprises or is made of a conductor structure especially in the form of the above mentioned coils or coil elements or coil structures which is/are reflective to ultrasound and minimally disturb the ultrasound field or beams, wherein reflective means that there is a significant mismatch between the acoustic impedances of the conductor structure and the ultrasound coupling medium, typically water. Such a reflectivity and a minimal disturbance is achieved to a desired extent by one or a combination of the following features:
   a.) the area covered by the conductor structure when projected from the ultrasound focus on the ultrasound transducer 11 is minimized;
   b.) the location of the conductor structure is chosen to minimize the effect on the ultrasound field or beams;
   c.) the shape of the (reflective) conductor structure is chosen to spread the reflected ultrasound field or beams evenly in order to avoid creating unwanted additional focuses from the reflected ultrasound field or beams.

By providing an RF transmit and/or receive antenna in the form of or comprising a conductor structure according to 1.) or 2.) above, especially in the form of coils or coil structures such that it minimally disturbs the ultrasound field or beams, more optimal coil structures can be created for the MRI thermometry. An exemplary embodiment of an RF transmit and/or receive antenna according to the invention comprises a first coil structure 13 in the form of or comprising a first and a second coil element 13a, 13b and shall be explained in more details with reference to FIGS. 5 and 6.

Figure 5:
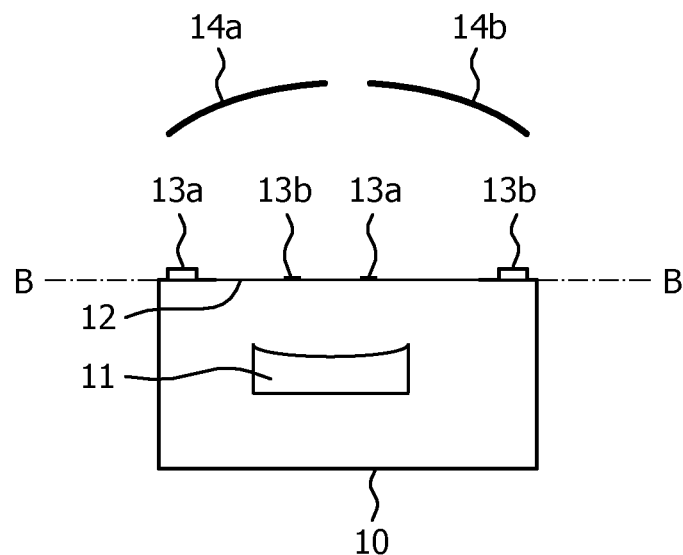
FIG. 5 shows a cross-sectional view of substantial components of a hybrid MR/HIFU system according to an exemplary embodiment of the invention.
Figure 6:
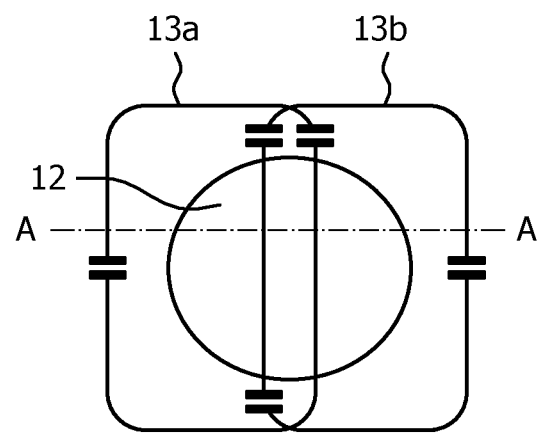
FIG. 6 shows a top view onto the components of the hybrid MR/HIFU system according to FIG. 5.

FIG. 5 shows a cross-sectional view along the line A-A in FIG. 6 of the related components of a hybrid MR/HIFU system comprising such an RF transmit and/or receive antenna. FIG. 6 shows a top view onto the MR/HIFU system according to FIG. 5 along the line B-B in FIG. 5. In FIG. 5, the representation of the examination object P has been omitted for clarity reasons only. With respect to the positioning of such an examination object P, reference is made to FIG. 3 and the related description. The same or corresponding components as in FIGS. 3 and 4 are denoted in FIGS. 5 and 6 with the same or corresponding reference numerals.

In FIG. 5, again a tank 10 with an ultrasound window 12 and including a coupling medium, which is typically water, and an ultrasound transducer 11 are shown.

Further, FIGS. 5 and 6 show the first coil structure 13 which according to the invention is formed by or comprises a first and a second coil element 13a, 13b, and the second coil structure comprising at least two coil elements 14a, 14b as indicated in FIG. 3.

As indicated in the top view of FIG. 6, a part of the first and the second coil elements 13a, 13b is crossing the ultrasound window 12 of the tank 10. In comparison to the first coil structure 13 indicated in FIG. 4, the first and the second coil element 13a, 13b of the first coil structure according to the invention each cover about half the area of the known first coil structure 13. The coil elements 13a, 13b are arranged side by side preferably such, that they are overlapping each other, wherein at least the overlapping area crosses the ultrasound window 12 and, apart from this, both coil elements 13a, 13b together surround the ultrasound window 12.

Generally, the arrangement and selection of the coil elements 13a, 13b and of possibly further coil elements is selected such that the quality of the MR image of the target tissue TT which is generated by means of these coil elements 13a, 13b, . . . is improved in comparison to the first coil element 13 shown in FIGS. 3 and 4 and sufficient for monitoring and controlling the HIFU heating process.

Especially those parts of the coil elements 13a, 13b which cross the ultrasound window 12 are made as explained above under 1.) and 2.), so that they only minimally disturb the ultrasound field or beams. The other parts of the coil elements 13a, 13b which are positioned outside the ultrasound window 12 or surround the same can be made using conventional coil techniques or in the same way as those parts which are crossing the ultrasound window 12.

The above RF transmit and/or receive antenna is not limited to any particular coil geometry, number of coil elements and/or only a part of the coil elements being exposed to ultrasound. Multitude of coil designs can be created utilizing the principles of the invention as explained above under 1.) and 2.).

In the following, some exemplary embodiments of conductor structures which effect only a minimal disturbance of the ultrasound field or beams as explained above under 1.) and 2.) when used in an RF transmit and/or receive antenna according to the invention shall be described with reference to FIGS. 6 and 7.

Figure 7:
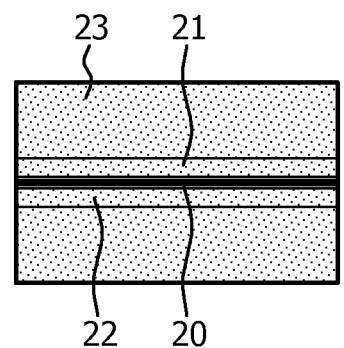
FIG. 7 shows a cross section through a part of a thin transparent coil element structure according to an embodiment of the invention.

FIG. 7 shows in a cross section an embodiment of a thin conductor structure which is transparent for the ultrasound field or beams. It comprises a thin copper strip 20 between a first and a second thin plastic sheet 21, 22. Instead of plastic, of course other suitable materials can be used. Such conductor structures can be created using available flexible printed circuit board materials and manufacturing techniques. In these materials a copper thickness of <50 μm and a plastic thickness of <100 μm are easily available and fulfill the requirement for a material which is "thin" at typical ultrasound frequencies of 1-2 MHz and consequently transparent to ultrasound fields or beams of this frequency.

The invention is not limited to three layer structure 20, 21, 22 or to flexible printed circuit board materials or to the same materials on both sides of the conductor 20 or the thicknesses mentioned above, all as long as the "thin" and low ultrasound loss conditions are fulfilled.

Another embodiment of a conductor structure according to the invention comprises two copper layers 20 having a thin dielectric material between them so that an ultrasound transparent capacitor is provided. Such a conductor structure can be used in an RF transmit and/or receive antenna according to the invention for tuning the same to an MR resonance frequency.

According to another embodiment of the invention the conductor structure can be made transparent for ultrasound by the above mentioned acoustic matching using a similar structure as shown in FIG. 7. In this embodiment of the conductor structure the material and the thickness of the matching layers, for example the plastic layers 21 and 22, are chosen to match the ultrasound from the surrounding coupling medium 23 to the copper conductor 20. This can be done, for example, by utilizing the quarter wave transformation equation for appropriately selecting the material:

$$Z_{plastic} = \sqrt{Z_{copper} Z_{water}}$$

Here $Z_{plastic}$, $Z_{copper}$ and $Z_{water}$ are the acoustic impedances of the matching plastic layers 21, 22, of the copper conductor 20 and of the ultrasound coupling medium 23, respectively. The invention is not limited to such a three layer structure 20, 21, 22 or the above quarter wave matching.

Figure 8:
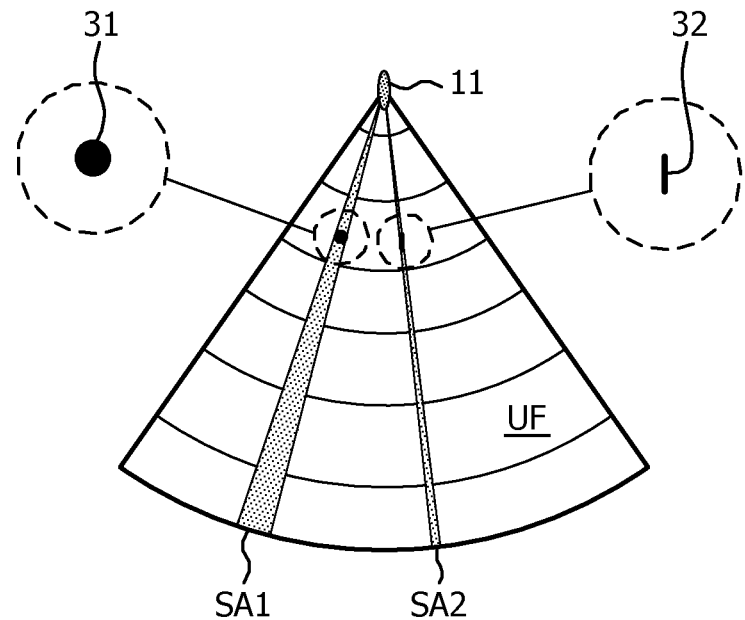
FIG. 8 shows a schematic cross-sectional view of a coil element structure according to another embodiment of the invention.

According to another embodiment of the invention shown in FIG. 8 the conductor structure which is reflective is made small in order to avoid blocking significant parts of the ultrasound field UF or beams transmitted by an ultrasound source or transducer 11.

More in details, in one embodiment the conductor structure utilizes circular or oval conductor rods 31 in order to optimize sufficient radio frequency conductance with minimal conductor diameter, thus minimizing the shaded area SA1 of the surface transducer 30 when projected from the focus. An additional advantage of the circular cross section is that the reflected ultrasound is spread to a large view.

According to another embodiment the conductor structure utilizes a conductor strip 32 with a substantially rectangular cross section which can be oriented within the ultrasound field for minimizing the shaded area SA2.

The invention is not limited to the above mentioned cross sections of the conductor structures. Also other such cross sections can be selected in order to obtain a minimized shaded area.

Summarizing the above, the second embodiment of the RF transmit and/or receive antennas according to the invention can especially be utilized in MRI guided HIFU therapy devices to enable more accurate MRI thermometry of the heated target as well as the safety monitoring of the unwanted heating for example in the ultrasound near field. More accurate means here a decreased temperature uncertainty and a better spatial and temporal resolution, which improves the accuracy of the thermal dose estimation.

A further advantage of an RF transmit and/or receive antenna according to the second embodiment of the invention is that it can be used to improve the image quality of the HIFU therapy planning images.

Another advantage of an RF transmit and/or receive antenna according to the second embodiment of the invention is that it can be used to create multi-channel coils with optimized spatial sensitivities to enable parallel imaging during the HIFU planning and treatment. The parallel imaging can be used to decrease the time required for HIFU treatment planning In MRI thermometry parallel imaging can be used to increase the temporal resolution and also to minimize the MRI thermometry imaging sequence artifacts, for example, through shorter echo chains of the rapid imaging techniques such as echo planar imaging.

While the invention has been illustrated and described in detail in the drawings and foregoing description, such illustration and description are to be considered illustrative or exemplary and not restrictive, and the invention is not limited to the disclosed embodiments. Variations to the embodiments of the invention described in the foregoing, e.g. with respect to the conductor structures themselves which form the RF transmit and/or receive antennas, the shapes and numbers and arrangements and materials of the conductor structures, coil structures and coil elements in relation to each other, in order to obtain the above explained results, are possible without departing from the basic principle of the invention as defined by the accompanying claims.

Variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. Any reference signs in the claims should not be construed as limiting the scope.

The invention claimed is:

1. RF transmit and/or receive antenna, in particular for use in a hybrid magnetic resonance imaging (MRI) system which comprises a high intensity focused ultrasound (HIFU) system, wherein the RF transmit and/or receive antenna comprises a conductor structure which only minimally disturbs the ultrasound field or beams, generated by the HIFU system, by providing the conductive structure transparent to the ultrasound field or beams.

2. RF transmit and/or receive antenna according to claim 1, wherein the transparency to the ultrasound field or beams is achieved by
a material of the conductor structure has an effective acoustic thickness of less than about one-tenth of a wavelength of the ultrasound field or beams.

3. RF transmit and/or receive antenna according to claim 1, wherein the conductor structure is formed by a multilayer laminate or PCB structure.

4. RF transmit/and or receive antenna according to claim 3 wherein the conductor structure comprises a thin copper strip having a copper thickness of less than 50 μm between a first and a second thin plastic sheet having a plastic thickness of less than 100 μm.

5. RF transmit and/or receive antenna according to claim 1, wherein the conductive structure only minimally disturbs the ultrasound field beams, further by providing the conductive structure reflective to the ultrasound field beams by one or a combination of the following features:
the area covered by the conductor structure when projected from an ultrasound focus on an ultrasound transducer (11) is sufficiently minimized;
the location of the conductor structure is chosen to sufficiently minimize the effect on the ultrasound field or beams;
the shape of the conductor structure is chosen to spread the reflected ultrasound field or beams evenly in order to avoid creating unwanted additional focuses from the reflected ultrasound field or beams.

6. RF transmit and/or receive antenna according to claim 1, comprising a first coil structure (13a, 13b) which at least partially extends across an ultrasound window (12) of the HIFU system.

7. RF transmit and/or receive antenna according to claim 1, which is provided in the form of a whole body coil for use in a vertical or an axial MRI system.

8. RF transmit and/or receive antenna according to claim 1, which is provided in the form of a surface coil or birdcage coil or breast coil.

9. Hybrid MRI system comprising an MRI system and a HIFU system and an RF transmit and/or receive antenna according to claim 1.

10. RF transmit and/or receive antenna according to claim 1, wherein the transparency to the ultrasound field or beams is achieved by a thickness of the conductor structure chosen to sufficiently minimize the reflections at an ultrasound coupling medium by acoustic matching.

11. RF transmit and/or receive antenna according to claim 1, wherein the transparency to the ultrasound field or beams is achieved by a the material of the conductor structure chosen to have sufficiently low acoustic losses in order to avoid significant absorption of the ultrasound energy.

* * * * *